(12) United States Patent
Kakefu

(10) Patent No.: US 9,040,362 B1
(45) Date of Patent: May 26, 2015

(54) METHOD OF MANUFACTURING A MOS TYPE SEMICONDUCTOR DEVICE

(71) Applicant: FUJI ELECTRIC CO., LTD., Kawasaki-shi (JP)

(72) Inventor: Mitsuhiro Kakefu, Matsumoto (JP)

(73) Assignee: FUJI ELECTRIC CO., LTD., Kawasaki-Shi (JP)

( * ) Notice: Subject to any disclaimer, the term of this patent is extended or adjusted under 35 U.S.C. 154(b) by 0 days.

(21) Appl. No.: 14/512,377

(22) Filed: Oct. 10, 2014

(30) Foreign Application Priority Data

Nov. 7, 2013 (JP) ................. 2013-231127

(51) Int. Cl.
| | |
|---|---|
| *H01L 29/66* | (2006.01) |
| *H01L 21/324* | (2006.01) |
| *H01L 29/16* | (2006.01) |
| *H01L 21/223* | (2006.01) |

(52) U.S. Cl.
CPC ........ *H01L 29/66333* (2013.01); *H01L 21/324* (2013.01); *H01L 29/16* (2013.01); *H01L 21/223* (2013.01)

(58) Field of Classification Search
USPC ................................. 438/135, 138
See application file for complete search history.

(56) References Cited

U.S. PATENT DOCUMENTS

| | | | |
|---|---|---|---|
| 2007/0000427 A1* | 1/2007 | Umeno et al. | ..... 117/3 |
| 2010/0290971 A1* | 11/2010 | Itou et al. | ..... 423/348 |

FOREIGN PATENT DOCUMENTS

| | | |
|---|---|---|
| JP | 2004-186620 A | 7/2004 |
| JP | 2006-080269 A | 3/2006 |
| JP | 2008-091853 A | 4/2008 |

* cited by examiner

*Primary Examiner* — Asok K Sarkar
(74) *Attorney, Agent, or Firm* — Rabin & Berdo, P.C.

(57) ABSTRACT

A method of manufacturing a MOS type semiconductor device, includes, before forming a semiconductor functional structure including a necessary MOS gate structure on one principal surface of a silicon semiconductor substrate, in the order recited, a first step of heating the silicon semiconductor substrate in an oxygen-containing atmosphere under heat treatment conditions including a heat treatment temperature of higher than 1,280° C. and a heat treatment time necessary for introducing oxygen up to a solid solution limit concentration in the silicon semiconductor substrate as a whole body; and a second step of holding the silicon semiconductor substrate at a specified temperature in a range from 1,000° C. to 1,200° C. The method achieves small turn-off loss and little variation of ON voltages without controlling a collector layer to a lower concentration than the conventional technology.

10 Claims, 13 Drawing Sheets

METHOD OF MANUFACTURING A MOS TYPE SEMICONDUCTOR DEVICE

CROSS-REFERENCE TO RELATED APPLICATION

This non-provisional application is based on, and claims priority to, Japanese Patent Application No. 2013-231127, filed on Nov. 7, 2013, the contents of which are incorporated herein by reference.

BACKGROUND OF THE INVENTION

1. Field of the Invention

The present invention relates to a method of manufacturing a MOS type semiconductor device such as an insulated gate bipolar transistor (IGBT) used in power conversion devices.

2. Description of the Related Art

The following shows an outline of wafer processing in a method of manufacturing an IGBT having a MOS gate structure of a planar type or a trench type. A semiconductor substrate, which is a wafer, has a thickness of about 500 μm at the beginning of the wafer processing, whereas the thickness of the wafer is finally reduced to a value between 50 μm and 200 μm depending on the withstand voltage of the semiconductor device for a withstand voltage class of 600 V to 1,200 V. A non-punch-through (NPT) IGBT 100 of a planar gate type as shown in FIG. 6 has a semiconductor functional structure in one of the principal surface regions (the upper surface region in FIG. 6) of an n type floating zone (FZ) silicon semiconductor substrate 101. The semiconductor functional structure comprises: a p base region 102, a gate oxide film 103, a gate electrode 104, an $n^+$ emitter region 105, an interlayer dielectric film 106, and an emitter electrode 107. On the rear surface side, after the thickness reduction process and surface treatment, formed are a $p^+$ collector layer 108 with a thickness of at most about 1 μm and a collector electrode 109. Thus the wafer processing in the manufacturing procedure for an IGBT 100 is completed.

On the other hand, a reverse-blocking IGBT 200 of a withstand voltage class of 1,200 V has, as shown in FIG. 13, an isolating diffusion layer 231 differently from the general IGBT 100 shown in FIG. 6. The isolating diffusion layer 231 is provided in order to enhance reliability of a reverse-blocking voltage (or a reverse withstand voltage) and the isolating diffusion layer 231 extends a reverse-blocking junction 207 to the substrate surface, which is protected with an oxide film, whereas the end of the reverse-blocking junction 207 is exposed to the sliced side surface of the substrate in the general IGBT 100. The reverse-blocking IGBT 200 is manufactured by the same procedure as the one for the general IGBT 100 excepting the process of forming the isolating diffusion layer 231, which will be described below.

An initial oxide film is formed as shown in FIG. 11 on a surface of an FZ n type silicon substrate 201, and in the initial oxide film an opening 220 is formed. Ion implantation of p type impurity boron is conducted through the opening 220 in the initial oxide film used for a mask. After removing the initial oxide film, heat treatment in an oxidizing atmosphere is conducted at a high temperature of 1,300° C. for a long time of 300 hr to 330 hr to form a boron diffusion layer as shown in FIG. 12 having a depth of 220 to 230 μm that is to be used as an isolating diffusion layer 231.

After that, as in the general IGBT 100, a semiconductor functional structure in the front surface side is formed comprising: a p base region 202, an $n^+$ emitter region 203, a gate oxide film 204, a gate electrode 205, an interlayer dielectric film 206, and an emitter electrode 209 as shown in FIG. 13. Likewise in the rear surface side conducted are thickness reduction and formation of a $p^+$ collector layer 210 and a collector electrode 211. Thus, a reverse-blocking IGBT 200 is manufactured as shown in FIG. 13.

The general IGBT 100 exhibits a tradeoff relationship between an ON voltage and a turn-off loss. In some cases, an adjustment is demanded to achieve a higher speed and lower loss at the expense of the ON voltage, which means a larger ON voltage. In that case, the process conditions are to be controlled with the thickness of the $p^+$ collector layer 103 to be thin and the impurity concentration therein to be low so that the injection of minority carriers (positive holes) from the $p^+$ collector layer 108 is decreased in a forward-biased period.

In the NPT IGBT 100, the drift layer 101 is made sufficiently thick so that the depletion layer 110 extending from the junction 102a of the p base region 102 into the drift layer 101 on application of OFF time voltage does not arrive at the $p^+$ collector layer 108, which means punch-through does not occur. As a consequence, the ON voltage of the NPT IGBT 100 increases. There is another problem of large turn-off loss due to increased reverse recovery current caused by increase in carriers accumulated in the emitter side of the drift layer 101 in the turn-off time when the total amount of impurities in the $p^+$ collector layer 108 is large.

Concerning an IGBT having this construction, Japanese Unexamined Patent Application Publication No. 2006-080269 (Patent Document 1) discloses a low injection reverse-blocking IGBT that uses a wafer having a gradient distribution of oxygen concentration, in which oxygen concentration gradually decreases from a region of solid solution limit in the bulk to the wafer surface region. The oxygen has been introduced up to a concentration of solid solution limit with a flat distribution in whole the wafer by driving diffusion process in an oxygen atmosphere for about 100 hr, and then partly removed by outward diffusion from the substrate surface in the cooling down process.

Japanese Unexamined Patent Application Publication No. 2004-186620 (Patent Document 2) discloses a punch-through type IGBT in which the oxygen introduced into the bulk of a substrate up to a concentration of the solid solution limit is used for donors after heat treatment to form a high concentration n type buffer layer in the collector layer side of the n type drift layer. In the process of manufacturing this IGBT, the oxygen is introduced into the semiconductor wafer by heat treatment in an oxygen atmosphere at a temperature between 1,150° C. to 1,350° C., and then the introduced oxygen in the surface region is removed by heat treatment in an oxygen atmosphere at a lower oxygen concentration to obtain an oxygen concentration profile of two stage distribution.

Japanese Unexamined Patent Application Publication No. 2006-080269 (Patent Document 1 herein) relates to Paragraph 0005 and FIG. 2 in particular. Japanese Unexamined Patent Application Publication No. 2004-186620 (Patent Document 2 herein) relates to Claim 5 and the Abstract in particular.

However, in an attempt to reduce the turn-off loss, if the impurity concentration in the collector layer of the IGBT is further decreased, this is liable to increase variation of the ON voltages. Thus, it is generally difficult to control the collector layer to a lower concentration than in conventional technologies. It is also difficult to reduce the turn-off loss in a stable manner by means of decreasing the collector layer thickness, because the collector layer thickness has been decreased nearly to the lower limit.

The present invention has been made in view of the problems described above and an object of the present invention is to provide a method of manufacturing a MOS type semiconductor device that achieves small turn-off loss and little variation of ON voltages without controlling a collector layer to a lower concentration than the conventional technology.

SUMMARY OF THE INVENTION

In order to achieve the above object, a method of manufacturing a MOS type semiconductor device of the present invention comprises, before a step of forming a semiconductor functional structure including a necessary MOS gate structure on one principal surface of a silicon semiconductor substrate, in the order recited: a first step of heat treatment in an oxygen-containing atmosphere under heat treatment conditions including a heat treatment temperature of higher than 1,280° C. and a heat treatment time necessary for introducing oxygen up to a solid solution limit concentration in the silicon semiconductor substrate as a whole body; and a second step of holding the semiconductor substrate at a specified temperature in a range from 1,000° C. to 1,200° C.

Preferably, the holding temperature in a range from 1,000° C. to 1,200° C. in the second step is 1,200° C. and a holding time at this temperature is in the range from 15 hours to 25 hours.

Preferably, the heat treatment conditions in the first step are a heat treatment temperature of 1,300° C. and the heat treatment time in the range from 1 hour to 100 hour.

Preferably, the oxygen-containing atmosphere is a mixed gas of 20 volume percent of oxygen and 80 volume percent of argon.

Preferably, a rate of cooling down from the heat treatment temperature in the first step to the specified temperature in the second step is 0.5° C./minute.

Preferably, the MOS type semiconductor device is an insulated gate bipolar transistor.

According to the invention, a method of manufacturing a MOS type semiconductor device is provided that achieves small turn-off loss and little variation of ON voltages without controlling a collector layer to a lower concentration than the conventional technology.

DETAILED DESCRIPTION OF THE INVENTION

Some preferred embodiments of the present invention for manufacturing a MOS type semiconductor device, as well as comparative examples, will be described in detail in the following with reference to the accompanying drawings. In this specification and accompanying drawings, the layers and regions preceded by "n" and "p" mean that they have majority carriers of electrons or positive holes, respectively. The mark "+" and "−" appended to "n" and "p" mean that the impurity concentration is relatively high or low, respectively. In the specification and accompanying drawings, the same symbol is given to the similar structure, and repeated description is avoided. The accompanying drawings for illustration of embodiments are not depicted with a correct scale or relative dimensions for easy viewing and better understanding. The present invention is not limited to the embodiment examples shown below but applied to any variations and modifications within the spirit and scope of the invention.

Figure 1:
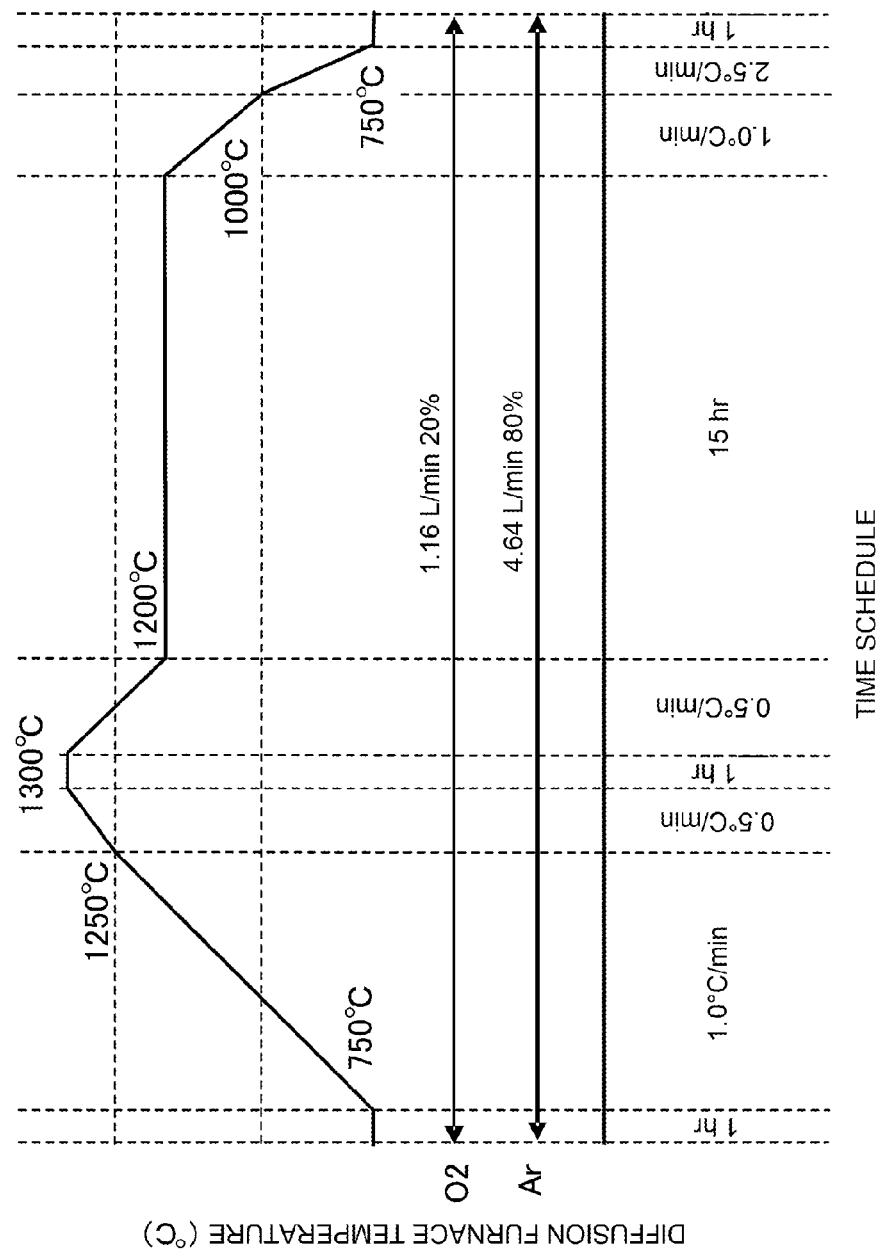
FIG. 1 is a diagram of a diffusion furnace temperature versus time program in an oxygen donor-introducing process according to Embodiment Example 1 of the present invention.
Figure 2:
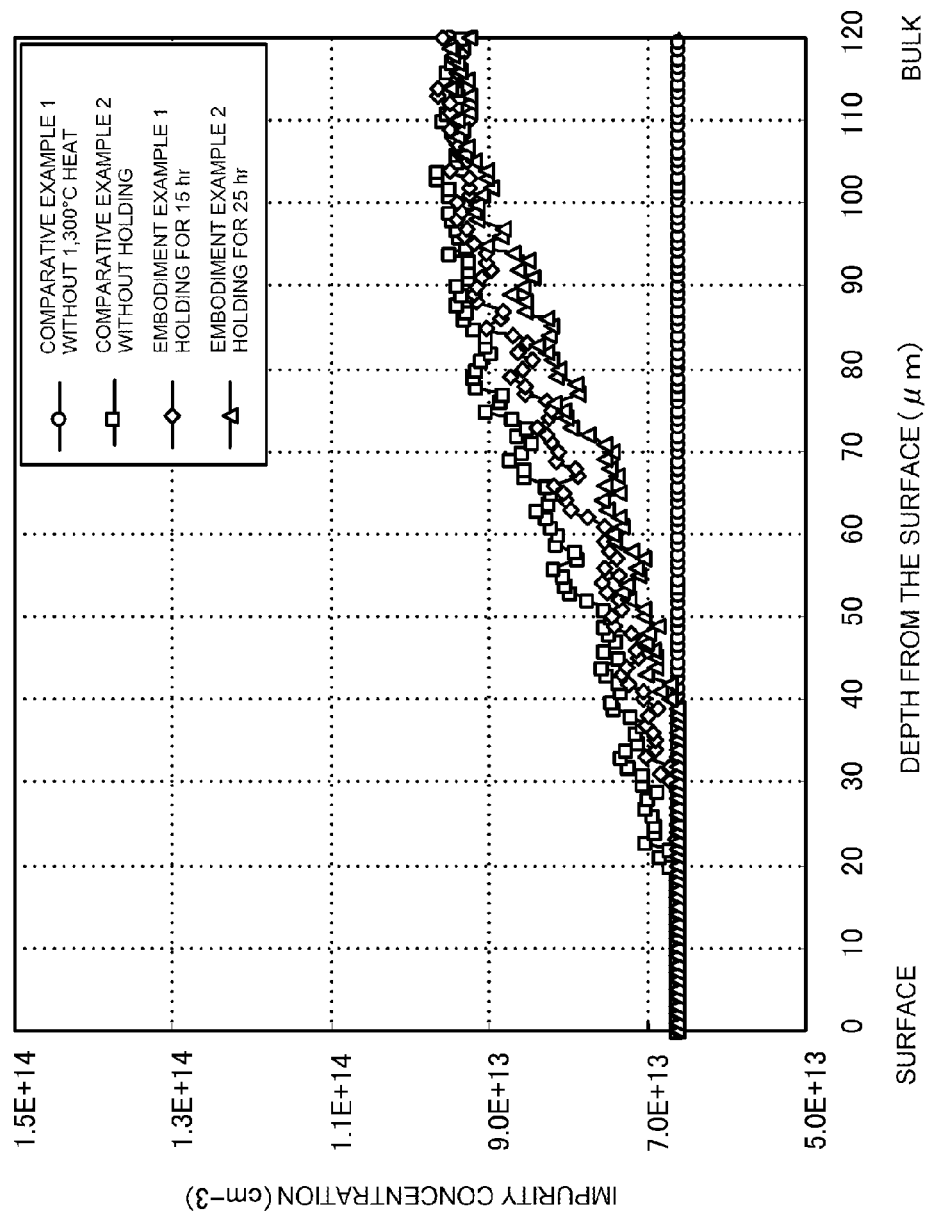
FIG. 2 shows distribution of oxygen donor concentration in the surface region of the silicon semiconductor substrate in Embodiment Examples 1 and 2 and Comparative Examples 1 and 2.

FIG. 1 shows a time schedule of the diffusion furnace temperature in the oxygen donor introducing process according to Embodiment Example 1 of the present invention, the process being conducted before forming a semiconductor functional structure in the front surface side of the substrate of an IGBT. FIG. 2 shows distribution of oxygen donor concentration in the surface region of the silicon substrate, in which the ordinate designates impurity concentration and the abscissa designates the depth from the substrate surface. FIG. 2 shows impurity concentration distribution in the direction of substrate depth for Comparative Example 1 without the heat treatment to introduce oxygen donors, Comparative Example 2 with the heat treatment at 1,300° C. for 1 hr and without holding at 1,200° C., Embodiment Example 1 with the heat treatment at 1,300° C. for 1 hr and followed holding process at 1,200° C. for 15 hr, and Embodiment Example 2 with the heat treatment at 1,300° C. for 1 hr and followed holding process at 1,200° C. for 25 hr. Embodiment Example 2 and Comparative Example 2 are same as Embodiment Example 1 except that the holding time at 1,200° C. is 25 hr for the former and that the holding process is eliminated for the latter.

The wafer processing in the manufacturing procedure of an IGBT of a withstand voltage of 1,200 V class having a MOS gate structure of a planar type or trench type of the present invention features heat treatment of the silicon semiconductor substrate in an oxygen-containing atmosphere at a temperature of higher than 1,280° C., for example 1,300° C., for at least 1 hr, the heat treatment being conducted before forming a semiconductor functional structure in the substrate surface region that is formed in a manufacturing procedure of general IGBTs. The manufacturing method of the invention also features a process of holding the substrate, after the heat treatment at 1,300° C., in an oxygen-containing atmosphere at a temperature in the range from 1,000° C. to 1,200° C. for at least 1 hr, preferably for a period from 15 hr to 25 hr. As a result, the oxygen introduced into the n type silicon substrate up to the solid solution limit by the heat treatment at 1,300° C. functions as a donor and raises the n type impurity concentration in the silicon substrate. The oxygen is introduced to the concentration of solid solution limit in the heat treatment at 1,300° C. in the time schedule of diffusion furnace temperature shown in FIG. 1. In the cooling down process to the temperature of extraction from the furnace of about 750° C. or lower, the solid solution limit concentration itself also decreases and the oxygen exceeding the solid solution limit concentration is removed from the surface of the silicon substrate through outward diffusion. As a consequence, the distribution of oxygen concentration in the substrate cooled down to the room temperature, different from the distribution at the high temperature of 1,300° C., is a declined distribution as for Comparative Example 2 and Embodiment Examples 1 and 2 in FIG. 2, in which the concentration is low in the surface side of the substrate (which has a resistivity of 80 Ω-cm) and high in the bulk thereof.

For Comparative Example 2 and Embodiment Examples 1 and 2, the oxygen concentration is lower in the substrate surface region than in the bulk of the substrate for the reason described above, and accordingly donorization of oxygen is retarded in the surface region. Thus, increase in the donor concentration is hindered in the surface region as compared in the bulk of the substrate. The concentration distribution is preferably flat over the bulk of the substrate. If the heat treatment in an oxygen atmosphere at 1,300° C. is conducted in a period shorter than 1 hr, the peak oxygen concentration introduced in the substrate does not reach the solid solution limit and the flat concentration distribution is not achieved. Therefore, the substrate has to experience heat treatment in an oxygen atmosphere at 1,300° C. in a time period of at least 1 hr. The heat treatment at 1,300° C. for 1 hr introduces the oxygen into the substrate up to the solid solution limit and achieves a concentration distribution near a flat distribution. Consequently, heat treatment longer than 1 hr does not provide a noticeable advantage. Rather, the time period is to be determined from the view point of efficiency of the manufacturing procedure. Heat treatment for a long time also raises a problem of surface roughening, and thus, the heat treatment time is desired within 100 hr.

A manufacturing method of the present invention comprises an additional heat treatment step for outward diffusion of the oxygen in the surface region of the wafer in the cooling down process from the 1,300° C. heat treatment step. It has been found by the inventor of the present invention that the additional heat treatment step can control the distribution of oxygen donor concentration in the region from the substrate surface to a depth of about 100 μm more precisely as compared with the heat treatment procedure of only heating up and cooling down. As shown in FIG. 2, the distribution of oxygen donor concentration in the region from the substrate surface to the depth of about 100 μm exhibits different declined distribution corresponding to the conditions of the heat treatment at 1,300° C. and thereafter. Moreover, it has been found by the inventor of the present invention that this difference in the declined distribution of oxygen donor concentration affects the ON voltage and turn-off loss in the IGBT. The present invention has been achieved based on this finding. The effects of the difference in the distribution or the additional heat treatment process will be described more in detail in the following.

Figure 3:
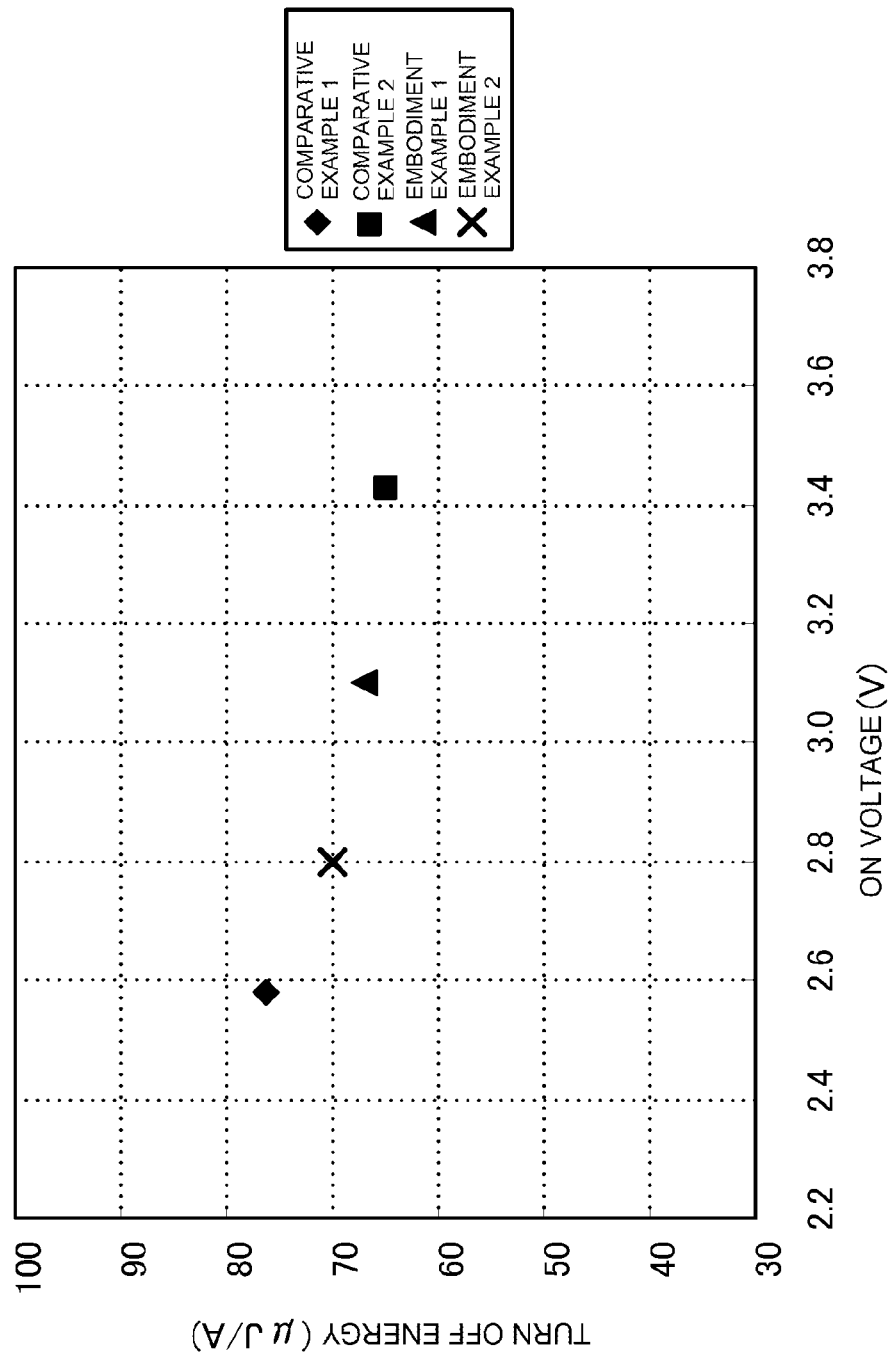
FIG. 3 shows the relationship between the ON voltage and the turn-off energy in Embodiment Examples 1 and 2 and Comparative Examples 1 and 2.

FIG. 3 shows a tradeoff relationship between the ON-voltage and the turn-off loss for Comparative Examples 1 and 2 and Embodiment Examples 1 and 2. FIG. 3 shows that the heat treatment at 1,300° C. for 1 hr causes high ON voltage but low turn-off energy (or turn-off loss) as in the case of Comparative Example 2. An additional holding process at 1,200° C. after the heat treatment at 1,300° C. for 1 hr, as in the cases of IGBTs of Embodiment Examples 1 and 2, achieves low ON voltages with a small increase in turn-off energy (turn-off loss).

A method of manufacturing an IGBT according to an embodiment of the invention comprises, in addition to the heat treatment in an oxygen-containing atmosphere at 1,300° C. for 1 hr, a step of holding the substrate at a high temperature of 1,200° C. for 15 hr (in Embodiment Example 1) or for 25 hr (in Embodiment Example 2). This additional holding step results in low oxygen concentration in the region of substrate surface side and hinders the donor function of oxygen restricting increase in the donor concentration. Therefore, the trade-off relationship between the turn-off loss and the ON voltage can be favorably adjusted as shown in FIG. 3.

Figure 4:
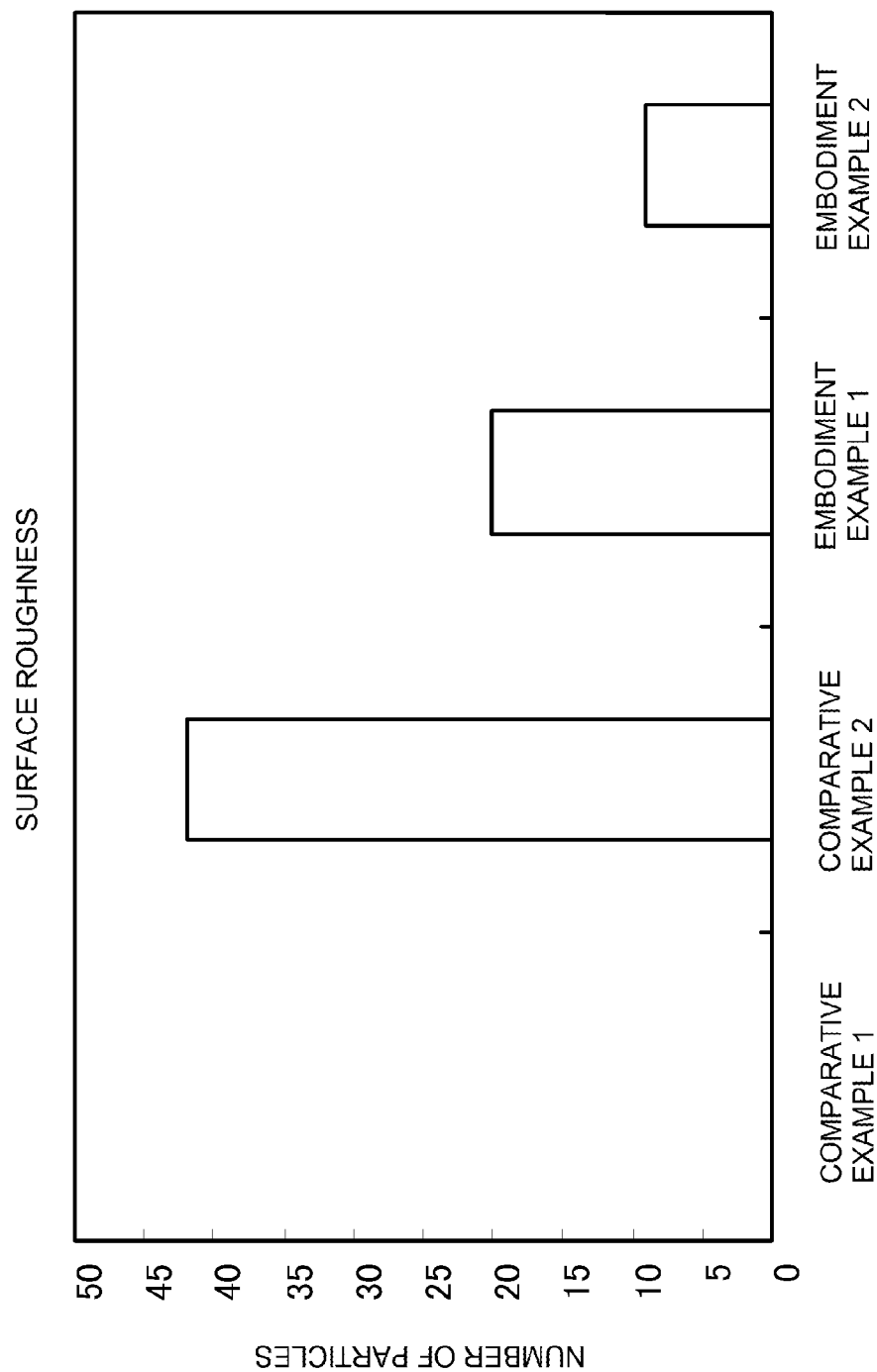
FIG. 4 is a graph showing the number of particles on the substrate surface, which is a type of index of surface roughness in Embodiment Examples 1 and 2 and Comparative Examples 1 and 2.

FIG. 4 is a bar graph showing particle numbers for Comparative Examples 1 and 2 and Embodiment Examples 1 and 2. FIG. 4 shows that the particles are generated for Comparative Example 2 and Embodiment Examples 1 and 2 in which a process of introducing oxygen donors are conducted. FIG. 4 also shows that the particle number is reduced by elongating the holding time at 1,200° C. The holding process at 1,200° C. drives the outward diffusion of oxygen in the substrate surface region and reduces oxygen concentration in this region, decreasing oxygen precipitates and the number of particles, which is a type of index of surface roughness. A gate oxide film that is formed on the substrate surface with large number of particles indicating rough surface includes a number of defects, causing gate failure. However, IGBTs produced by a manufacturing method of the invention is prevented from the gate failure.

In the IGBT in Comparative Example 2 with the heat treatment at 1,300° C. and without the holding at 1,200° C., positive hole injection into the drift region from the p$^+$ collector layer with high carrier concentration in the rear surface side is restricted as compared with an IGBT manufactured by a manufacturing method of the invention. Thus, high ON voltage and small turn-off energy result as shown in FIG. 3. The IGBT of Comparative Example 2, however, has higher carrier concentration in the substrate surface region than the IGBTs of Embodiment Examples 1 and 2 with holding process at 1,200° C., and thus generates more oxygen precipitates, increasing the number of particles, which causes gate failure. In contrast, the IGBTs of Embodiment Examples 1 and 2 with the holding process at 1,200° C. promote, as described above, the hole injection from the p$^-$ collector layer into the drift region. Thus, the ON voltage is lower than that in Comparative Example 2 and the turn-off energy remains small as shown in FIG. 3. Moreover, the low carrier concentration in the surface region reduces oxygen precipitation, reducing the number of particles, which decreases gate failure.

Figure 5:
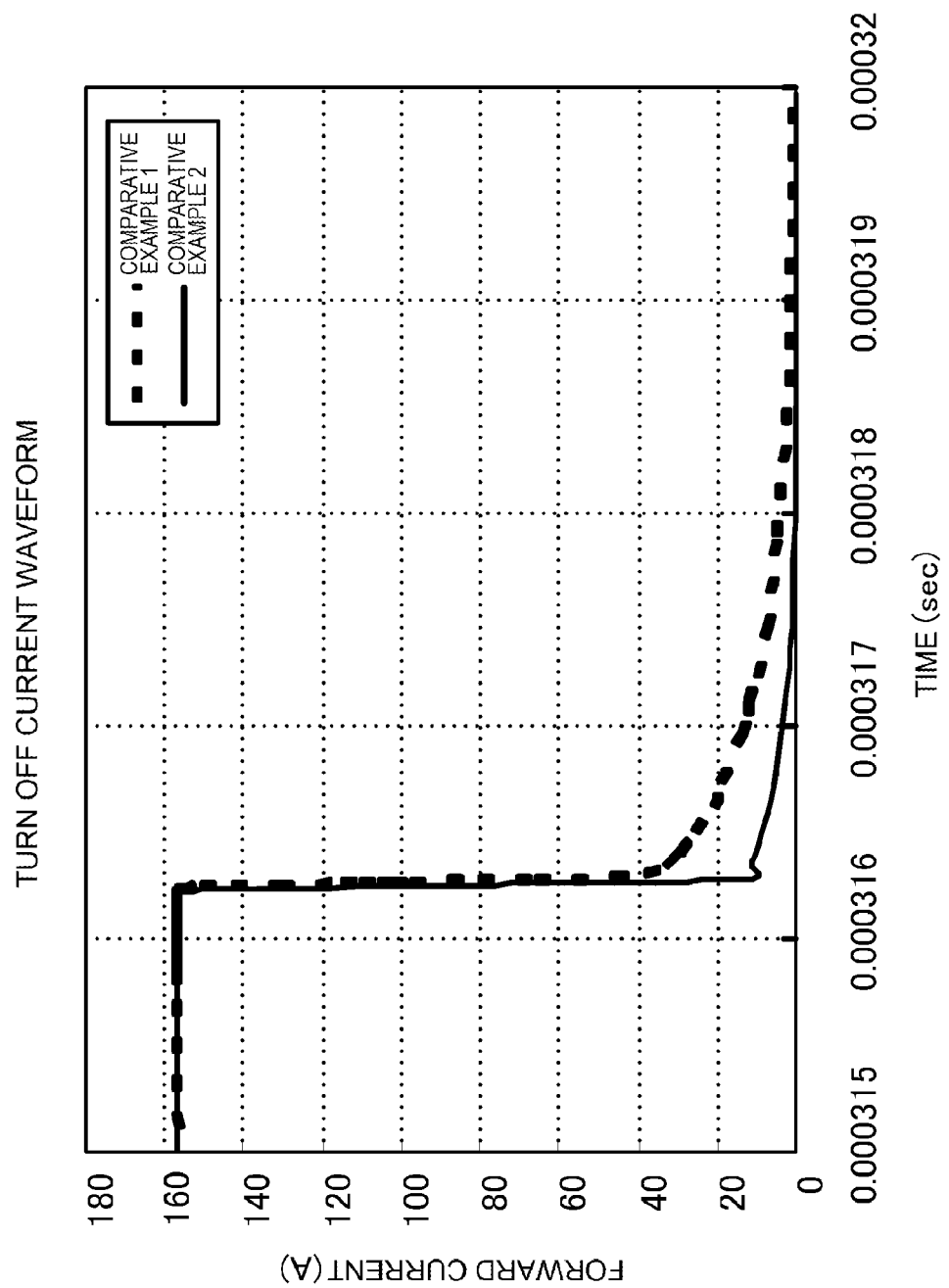
FIG. 5 shows waveforms of the current in a turning-off process in Comparative Examples 1 and 2.
Figure 6:
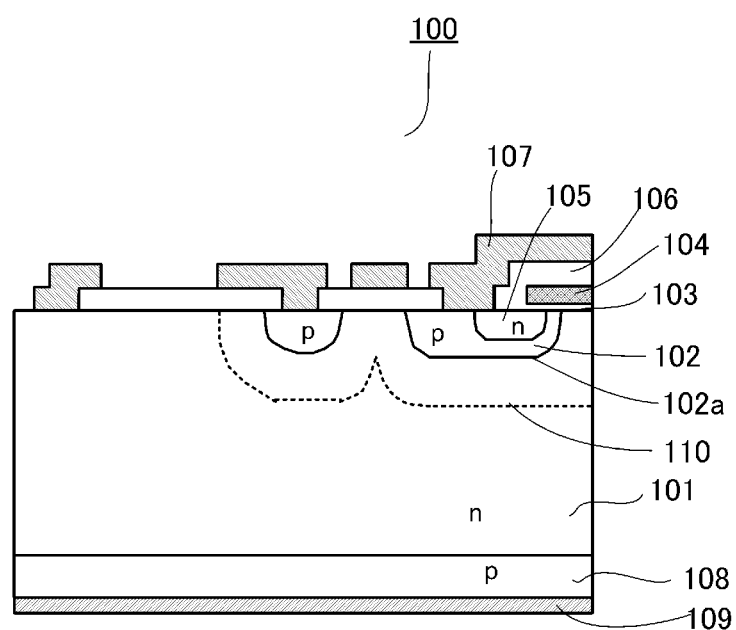
FIG. 6 is a sectional view of a peripheral region of a semiconductor substrate of a general IGBT.

FIG. 5 shows current waveforms in a turning off process for Comparative Examples 1 and 2. Though not indicated in FIG. 5, the current waveforms in a turning off process for Embodiment Examples 1 and 2 fall between the dotted line for Comparative Example 1 and the sold line for Comparative Example 2. Thus, the transient current is reduced as compared with Comparative Example 1 without a process for introducing oxygen donors.

According to the present invention described thus far, which comprises a process of heat treatment at 1,300° C. for 1 hr and a process of holding at 1,200° C. for a specified time period, donorization of oxygen can be controlled while restricting increase in the number of particles on the wafer surface. Carrier concentration in a substrate is controlled in a two stage declined distribution in which the concentration is low in the surface region and high in the bulk of the substrate. Positive hole injection from the $p^+$ collector layer to the drift region is controlled and the ON voltage can be regulated. Because donorization of oxygen does not cause variation in carrier concentration rise and declined carrier concentration due to outward diffusion in the substrate, the ON voltage characteristic is also prevented from variation.

Embodiment Example 1

The following describes a method of manufacturing an IGBT, the method being an embodiment example of a method of manufacturing a MOS type semiconductor device of the present invention. The description is made in detail mainly about characteristic aspects of the manufacturing method.

Figure 7:
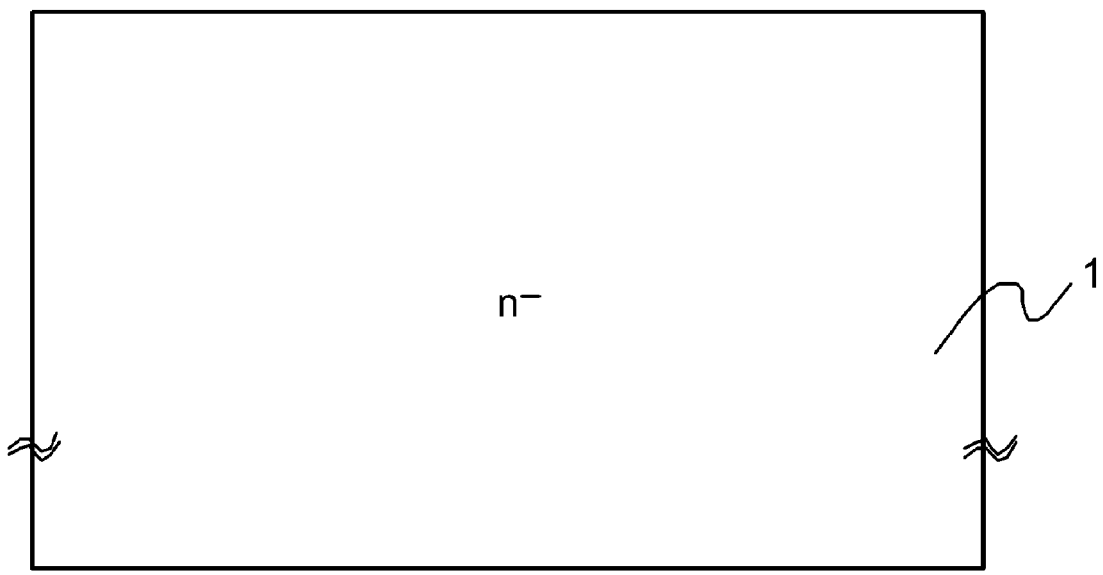
FIG. 7 is a first sectional view of a semiconductor substrate showing one of the main steps in a method of manufacturing an IGBT according to an embodiment of the present invention.

FIGS. 7 through 10 are sectional views of an essential part of a semiconductor substrate sequentially showing main steps in a method of manufacturing an IGBT according to Embodiment Example 1 of the present invention. The following description deals with a method of manufacturing an IGBT of withstand voltage of 1,200 V. An FZ n type silicon substrate 1 having a thickness of 500 µm and resistivity of 80 Ω-cm shown in the sectional view of FIG. 7 is put into a thermal diffusion furnace (not shown) that is filled with an oxygen-containing atmosphere with oxygen gas of 1.16 liter/min plus argon gas of 4.64 liter/min at a temperature of 750° C. The diffusion furnace temperature is changed along the time schedule shown in FIG. 1. After holding at 750° C. for about 1 hr, the furnace temperature is raised to 1,250° C. at a rate of 1.0° C./min and then raised from 1,250° C. to 1,300° C. at a rate of 0.5° C./min. The furnace temperature is held at the constant temperature of 1,300° C. for 1 hr. The furnace temperature is lowered from 1,300° C. to 1,200° C. at a rate of 0.5° C./min. At this temperature of 1,200° C., the furnace temperature is held for 15 hr. This process is one of the characteristics of the manufacturing method of the present invention. After that, the furnace temperature is lowered from 1,200° C. to 1,000° C. at a rate of 1.0° C./min and from 1,000° C. to 750° C. at a rate of 2.5° C./min. At this temperature of 750° C., the silicon substrate is extracted from the furnace.

Figure 8:
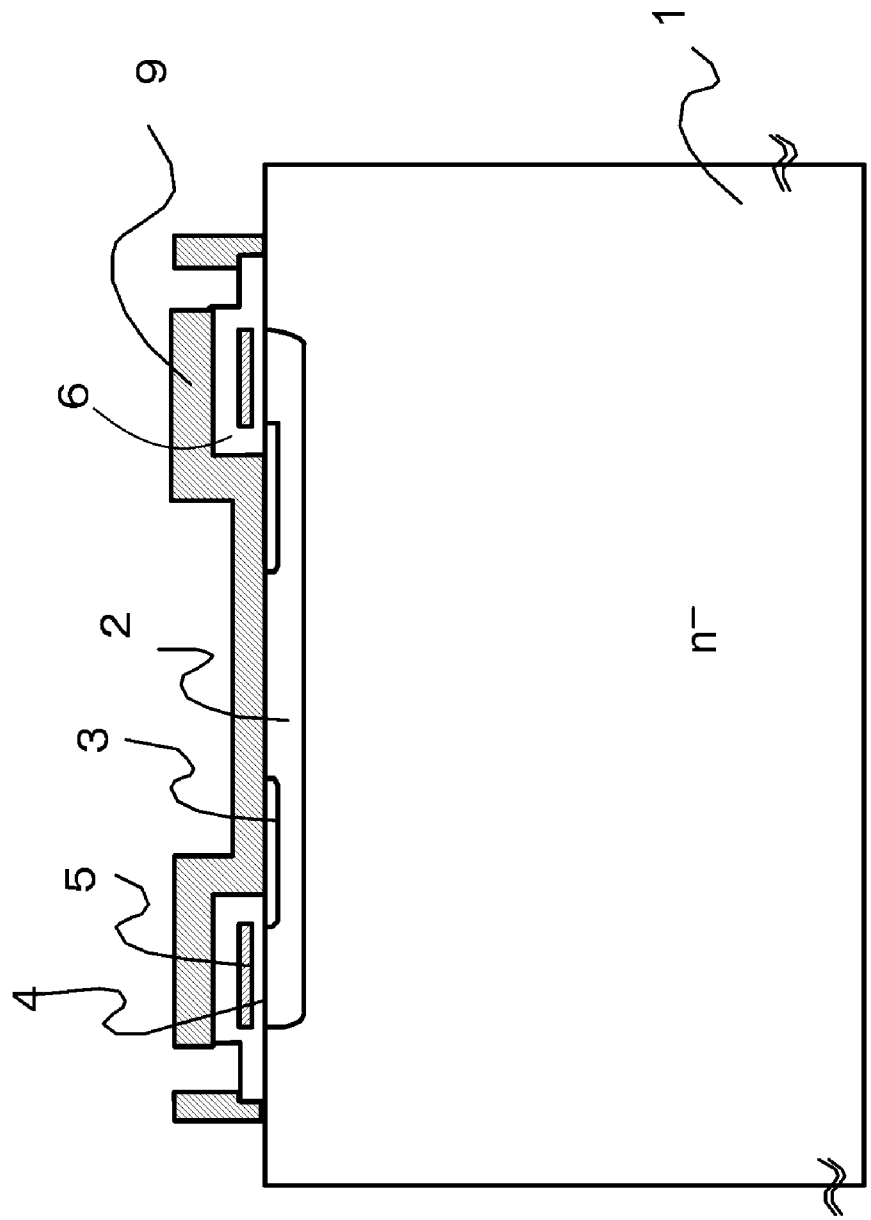
FIG. 8 is a second sectional view of a semiconductor substrate showing one of the main steps in a method of manufacturing an IGBT according to an embodiment of the present invention.
Figure 9:
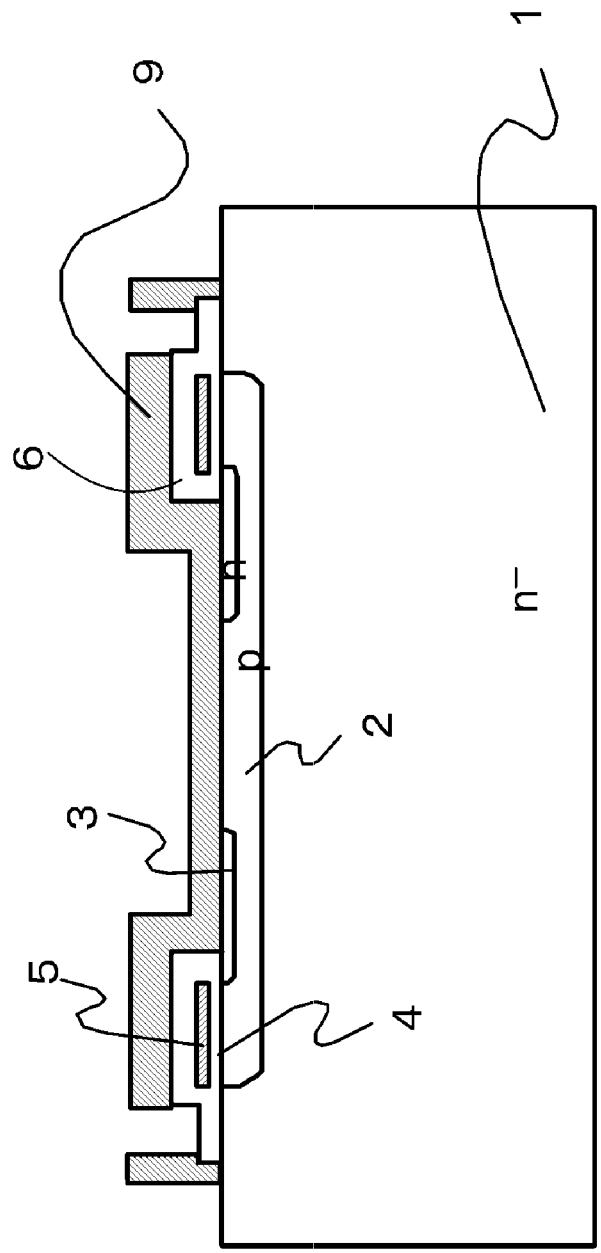
FIG. 9 is a third sectional view of a semiconductor substrate showing one of the main steps in a method of manufacturing an IGBT according to an embodiment of the present invention.
Figure 10:
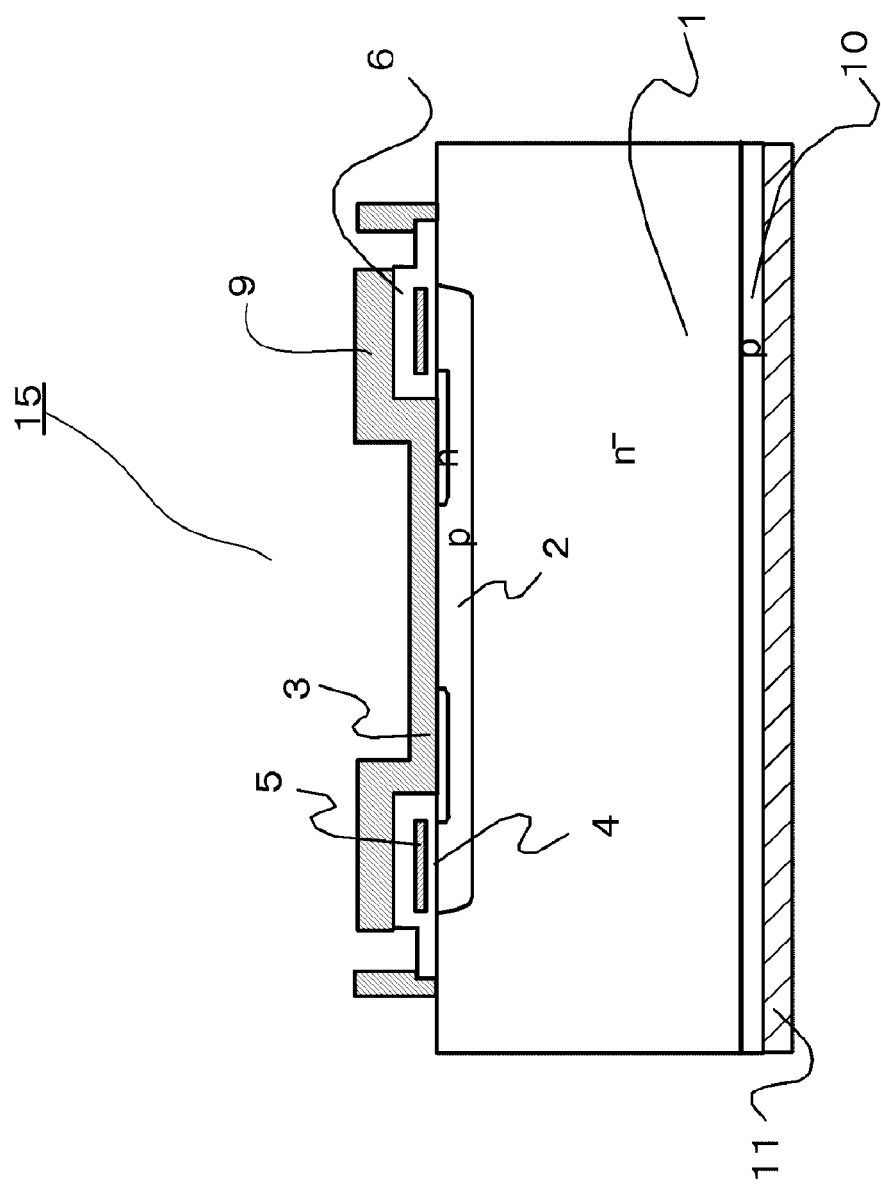
FIG. 10 is a fourth sectional view of a semiconductor substrate showing one of the main steps in a method of manufacturing an IGBT according to an embodiment of the present invention.
Figure 11:
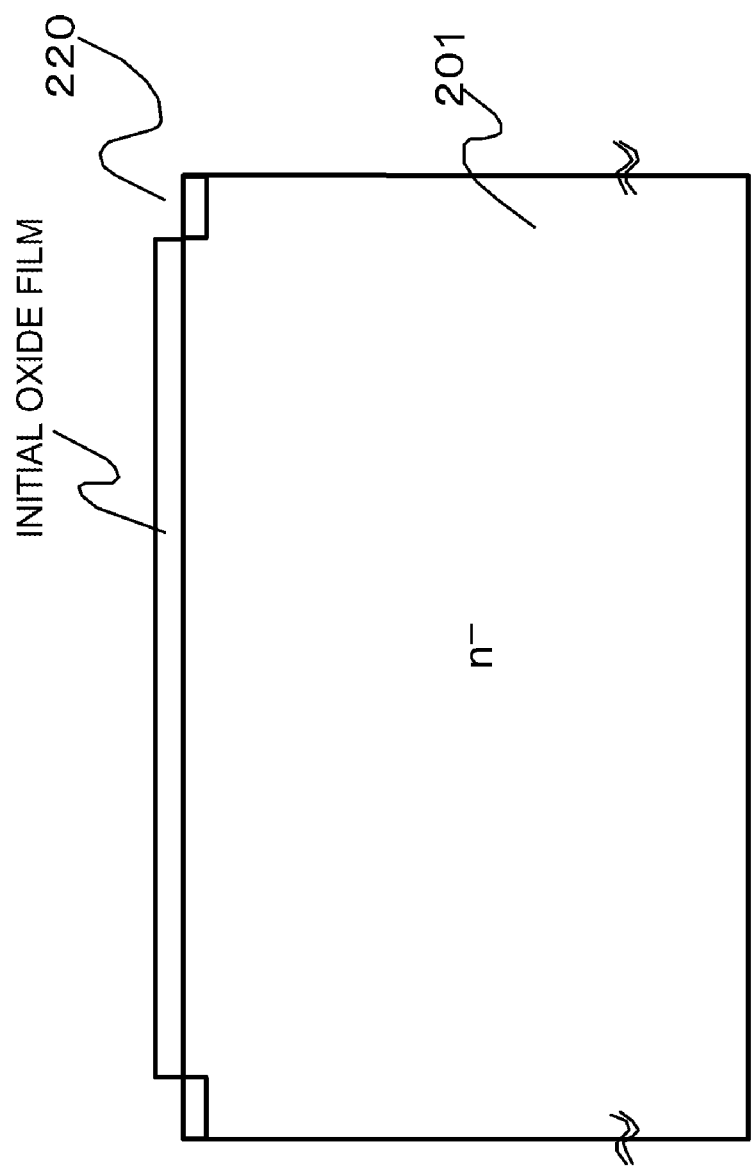
FIG. 11 is a first sectional view of a semiconductor substrate showing one of the main steps for forming an isolating diffusion layer of a reverse-blocking IGBT.
Figure 12:
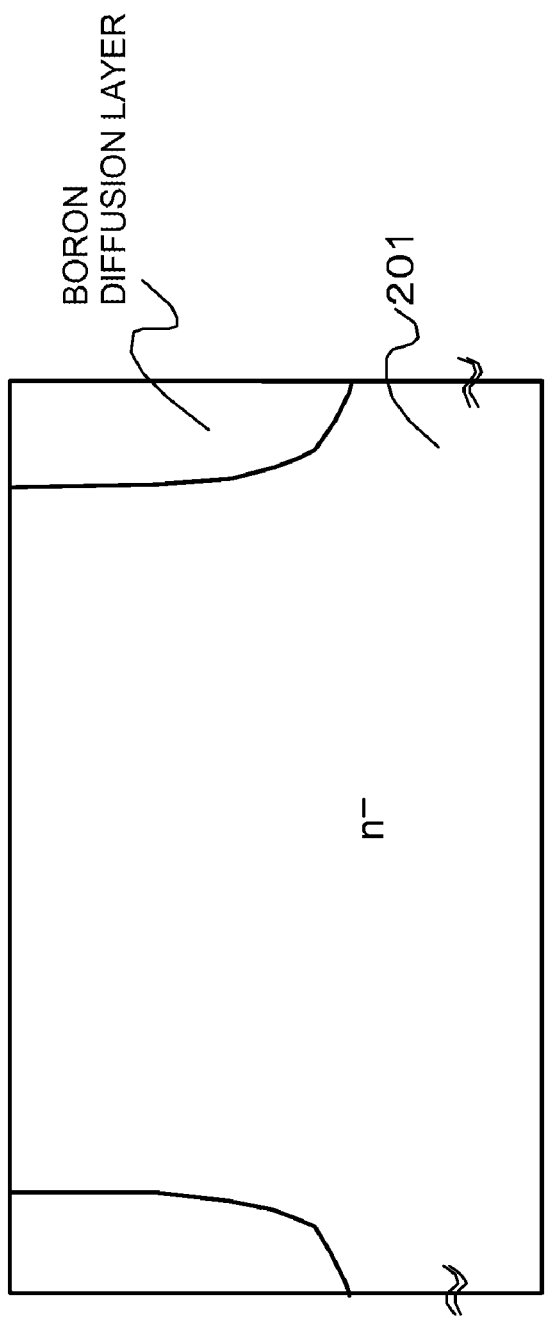
FIG. 12 is a second sectional view of a semiconductor substrate showing one of the main steps for forming an isolating diffusion layer of a reverse-blocking IGBT.
Figure 13:
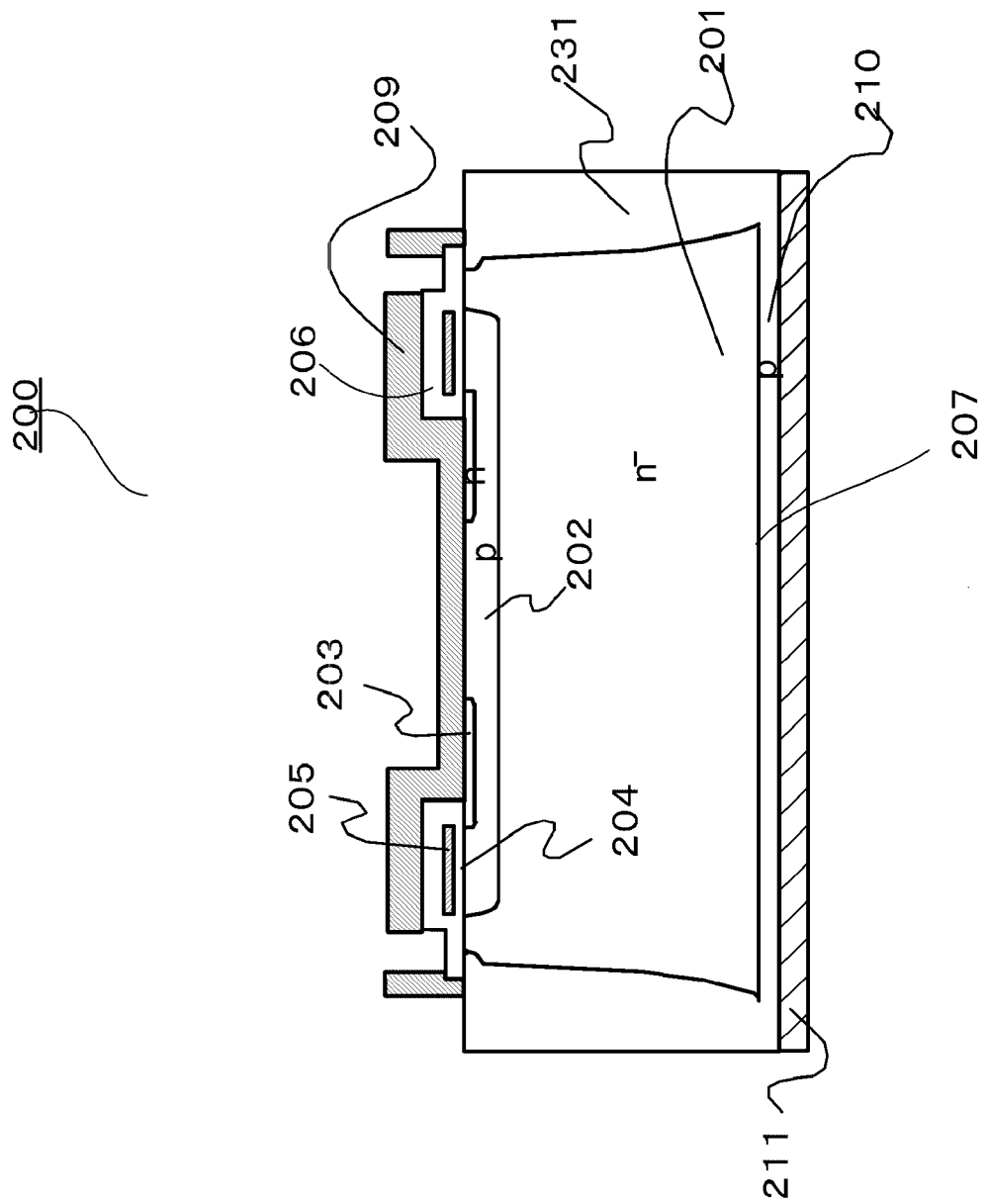
FIG. 13 is a third sectional view of a semiconductor substrate showing one of the main steps for forming an isolating diffusion layer of a reverse-blocking IGBT.

First, an initial oxide film (not depicted) is formed for forming a semiconductor functional structure on a front surface of the silicon substrate 1, which has experienced the heat treatment according to the time schedule of diffusion furnace temperature as shown in FIG. 1. The initial oxide film and a polysilicon film (not shown) deposited thereon are processed by means of photo-lithography. Then, usual manufacturing steps for an IGBT are conducted including ion implantation, sputtering deposition and heat treatment. The procedure is same as the one for manufacturing a usual planar gate type IGBT and fabricates, with a necessary pattern, a p base region 2, an $n^+$ emitter region 3, a gate oxide film 4, a gate electrode 5, an interlayer dielectric film 6, and an emitter electrode 9, as shown in FIG. 8. The gate structure of a planar gate type shown in FIG. 8 can be replaced by a known gate structure of a trench gate type (not shown). To achieve higher switching speed, lifetime killer is preferably introduced by means of electron beam irradiation or helium irradiation. Then as shown in FIG. 9, the rear surface side of the FZ silicon substrate 1 is ground to a thickness of about 200 µm. Then as shown in FIG. 10, a $p^+$ collector layer 10 having a thickness of about 1 µm or less and a peak concentration of activated boron of about $1 \times 10^{17}$ cm$^{-3}$ is formed by ion implantation of boron with a dose amount of $1 \times 10^{13}$ cm$^{-2}$ into the rear surface side of the silicon substrate and followed low temperature annealing at about 350° C. for about 1 hr. A collector electrode 11 is formed on the surface of the $p^+$ collector layer 10. Finally, the silicon substrate 1 is sliced into device chips to obtain IGBTs 15.

Embodiment Example 2

An IGBT was manufactured according to Embodiment Example 2 in the same conditions as in Embodiment Example 1 except that the holding process at 1,200° C. for 15 hr in Embodiment Example 1 was changed to a holding process at 1,200° C. for 25 hr in Embodiment Example 2.

An IGBT manufactured by a manufacturing method according to Embodiment Example 1 or 2 has experienced a process for introducing and donorizing oxygen at a high temperature of 1,300° C., and another process of holding at a temperature in the range from 1,000° C. to 1,200° C. for a specified period of time. Because these processes makes the impurity concentration in the front surface region of the silicon substrate lower than the impurity concentration in the bulk of the substrate, turn-off loss is reduced and variation of ON voltages is restricted without changing the thickness and impurity concentration of the collector layer on the rear surface side of the silicon substrate. Moreover, the number of particles due to oxygen precipitation is reduced on the front surface of the silicon substrate, preventing poor gate characteristic.

It is understood that various other modifications will be apparent to and can be readily made by those skilled in the art without departing from the scope and spirit of the present invention. Accordingly, it is not intended that the scope of the claims appended hereto be limited to the description set forth above but rather that the claims be construed as encompassing all of the features of patentable novelty which reside in the present invention, including all features which would be treated as equivalents thereof by those skilled in the art to which the invention pertains.

What is claimed is:

1. A method of manufacturing a MOS type semiconductor device, comprising, before forming a semiconductor functional structure including a necessary MOS gate structure on one principal surface of a silicon semiconductor substrate, in the order recited:
   a first step of heating the silicon semiconductor substrate in an oxygen-containing atmosphere under heat treatment conditions including a heat treatment temperature of higher than 1,280° C. and a heat treatment time necessary for introducing oxygen up to a solid solution limit concentration in the silicon semiconductor substrate as a whole body; and
   a second step of holding the silicon semiconductor substrate at a specified temperature in a range from 1,000° C. to 1,200° C.

2. The method of manufacturing a MOS type semiconductor device according to claim 1, wherein the specified temperature in the second step is 1,200° C. and a holding time at this temperature ranges from 15 hours to 25 hours.

3. The method of manufacturing a MOS type semiconductor device according to claim 2, wherein the MOS type semiconductor device is an insulated gate bipolar transistor.

4. The method of manufacturing a MOS type semiconductor device according to claim 1, wherein the heat treatment conditions in the first step are a heat treatment temperature of 1,300° C. and the heat treatment time ranges from 1 hour to 100 hour.

5. The method of manufacturing a MOS type semiconductor device according to claim 4, wherein the MOS type semiconductor device is an insulated gate bipolar transistor.

6. The method of manufacturing a MOS type semiconductor device according to claim 1, wherein the oxygen-containing atmosphere is a mixed gas of 20 volume percent of oxygen and 80 volume percent of argon.

7. The method of manufacturing a MOS type semiconductor device according to claim 6, wherein the MOS type semiconductor device is an insulated gate bipolar transistor.

8. The method of manufacturing a MOS type semiconductor device according to claim 1, wherein cooling down from the heat treatment temperature in the first step to the specified temperature in the second step takes place at a cooling down rate of 0.5° C./minute.

9. The method of manufacturing a MOS type semiconductor device according to claim 8, wherein the MOS type semiconductor device is an insulated gate bipolar transistor.

10. The method of manufacturing a MOS type semiconductor device according to claim 1, wherein the MOS type semiconductor device is an insulated gate bipolar transistor.

* * * * *